(12) United States Patent
Lu et al.

(10) Patent No.: US 9,911,813 B2
(45) Date of Patent: Mar. 6, 2018

(54) REDUCING LEAKAGE CURRENT IN SEMICONDUCTOR DEVICES

(71) Applicant: Massachusetts Institute of Technology, Cambridge, MA (US)

(72) Inventors: Bin Lu, Boston, MA (US); Elison de Nazareth Matioli, Cambridge, MA (US); Tomas Apostol Palacios, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/651,012

(22) PCT Filed: Dec. 11, 2013

(86) PCT No.: PCT/US2013/074500
§ 371 (c)(1),
(2) Date: Jun. 10, 2015

(87) PCT Pub. No.: WO2014/093555
PCT Pub. Date: Jun. 19, 2014

(65) Prior Publication Data
US 2015/0318360 A1  Nov. 5, 2015
US 2016/0133710 A9  May 12, 2016

Related U.S. Application Data

(60) Provisional application No. 61/735,604, filed on Dec. 11, 2012.

(51) Int. Cl.
*H01L 29/78* (2006.01)
*H01L 29/267* (2006.01)
(Continued)

(52) U.S. Cl.
CPC ........ *H01L 29/267* (2013.01); *H01L 21/0254* (2013.01); *H01L 21/02381* (2013.01);
(Continued)

(58) Field of Classification Search
CPC ............. H01L 21/8258; H01L 29/7786; H01L 29/267; H01L 21/02381; H01L 29/2003;
(Continued)

(56) References Cited

U.S. PATENT DOCUMENTS 4,998,150 A    3/1991  Rodder et al.
5,081,515 A *  1/1992  Murata ............ H01L 27/10805
                                                        257/296

(Continued)

OTHER PUBLICATIONS

International Search Report and Written Opinion from corresponding PCT Application No. PCT/US2013/074500 dated Apr. 17, 2014.
(Continued)

*Primary Examiner* — Fazli Erdem
(74) *Attorney, Agent, or Firm* — Wolf, Greenfield & Sacks, P.C.

(57) ABSTRACT

A semiconductor device includes a first region having a first semiconductor material and a second region having a second semiconductor material. The second region is formed over the first region. The semiconductor device also includes a current blocking structure formed in the first region between first and second terminals of the semiconductor device. The current blocking structure is configured to reduce current flow in the first region between the first and second terminals.

16 Claims, 10 Drawing Sheets

(51) Int. Cl.
*H01L 21/02* (2006.01)
*H01L 21/306* (2006.01)
*H01L 29/10* (2006.01)
*H01L 29/06* (2006.01)
*H01L 21/8258* (2006.01)
*H01L 29/778* (2006.01)
*H01L 29/20* (2006.01)

(52) U.S. Cl.
CPC .... *H01L 21/30604* (2013.01); *H01L 21/8258* (2013.01); *H01L 29/0649* (2013.01); *H01L 29/0688* (2013.01); *H01L 29/1033* (2013.01); *H01L 29/1079* (2013.01); *H01L 29/2003* (2013.01); *H01L 29/7786* (2013.01); *H01L 29/78* (2013.01)

(58) Field of Classification Search
CPC ............... H01L 21/28264; H01L 29/78; H01L 29/1079; H01L 29/1033; H01L 29/0688; H01L 29/0649; H01L 21/0254; H01L 21/30604
See application file for complete search history.

(56) References Cited

U.S. PATENT DOCUMENTS

| | | | |
|---|---|---|---|
| 5,399,900 | A | 3/1995 | Ko et al. |
| 5,501,893 | A | 3/1996 | Laermer et al. |
| 7,105,370 | B2* | 9/2006 | Bader ................... B82Y 20/00 257/E21.085 |
| 7,491,983 | B2* | 2/2009 | Otsuka ................ H01L 29/7787 257/183 |
| 7,709,269 | B2 | 5/2010 | Smith et al. |
| 2005/0242366 | A1 | 11/2005 | Parikh et al. |
| 2006/0118824 | A1* | 6/2006 | Otsuka ................ H01L 29/7787 257/194 |
| 2009/0045438 | A1 | 2/2009 | Inoue et al. |
| 2009/0146244 | A1 | 6/2009 | Tischler |
| 2009/0146245 | A1 | 6/2009 | Tischler |
| 2009/0148998 | A1 | 6/2009 | Tischler |
| 2009/0174040 | A1 | 7/2009 | Gogoi et al. |
| 2009/0189191 | A1* | 7/2009 | Sato .................... H01L 27/0605 257/195 |
| 2010/0009487 | A1 | 1/2010 | Huo et al. |
| 2011/0095335 | A1* | 4/2011 | Ishida ................. H01L 29/0611 257/190 |
| 2013/0099247 | A1* | 4/2013 | Palacios ............ H01L 21/28264 257/76 |
| 2014/0110717 | A1* | 4/2014 | Wenxu .............. H01L 21/02381 257/65 |
| 2015/0263229 | A1* | 9/2015 | Akiyama ............ H01L 33/0079 257/99 |

OTHER PUBLICATIONS

International Preliminary Report on Patentability in connection with Application No. PCT/US2013/074500 mailed Jun. 25, 2015.
Ayon et al., Characterization of a time multiplexed inductively coupled plasma etcher. Journal of Electrochem. Soc. 1999; (146): 339-49.
Beaumont et al., Epitaxial lateral overgrowth of GaN. Phys. Stat. Sol. 2001; B(227) 1: 1-43.
Buttari et al., Origin of etch delay time in Cl2 dry etching of AlGaN/GaN structures. Appl. Phys. Letter. 2003; 83(23): 4779-81.
Ikeda et al., High power AlGaN/GaN HFET with a high breakdown voltage of over 1.8 KV on 4 inch Si substrates and the suppression of current collapse. Proc. 20th International Symposium on Power Semiconductor Devices & IC's. May 2008: 287-90.
Krost et al., GaN-Based devises on Si. Phys. Stat. Sol. A. 2002; (194): 361-75.
Linthicum, GaN-on-Silicon Based Technology for RF Cellular and WiMax Infrastructure. Proc. Device Research Conference. Penn State University. Jun. 2006: 147-8.
Lu et al., High Breakdown (>1500 V) AlGaN/GaN HEMTs by Substrate-Transfer Technology. IEEE Elec. Dev. Lett. Sep. 2010; 31(9): 951-3.
Matioli et al., Growth of embedded photonic crystals for GaN-based optoelectronic devices. Journal Appl. Phys. 2009; (106): 024309.
Micovic et al., GaN enhancement/depletion-mode FET logic for mixed signal applications. Electronics Letts. 2005; 41(19).
Momose et al., Ultrathin gate oxide CMOS on (111) surface-oriented Si substrate. IEEE Trans. on Electron Devices. 2002; (49): 1597-605.
Palacios et al., High Power AlGaN/GaN HEMTS for Ka-band Applications. Elect. Dev. Lett. 2005; (26): 781-3.
Palacios et al., Optimization of AlGaN/GaN HEMTs for high frequency operation. Phys. Stat. sol. 2006; (203): 1845-50.
Selvaraj et al., Breakdown enhancement of AlGaN/GaN HEMTs on 4-in Silicon by improving the GaN Quality on thick buffer layers. IEEE Elec. Dev. Lett. Jun. 2009; 30(6): 587-9.
Suh et al., High-breakdown Enhancement-Mode AlGan/Gan HEMTs with integrated slant field-plate. IEEE Int. Electron Dev. Meeting. San Francisco. Dec. 2006 3 pages.
Wu et al., 40 W/mm double Field-plated HEMTs. Proceeding of IEEE Device Research Conference. 2006; 151-2.
Wum et al., An insulator-lined silicon substrate-via technology with high aspect ratio. IEEE Trans. on Electron Dev. 2001; 48(9): 2181-3.

* cited by examiner

REDUCING LEAKAGE CURRENT IN SEMICONDUCTOR DEVICES

CROSS-REFERENCE TO RELATED APPLICATIONS

This application is a U.S. National Stage of PCT/US2013/074500, filed Dec. 11, 2013, and titled "Reducing Leakage Current in Semiconductor Devices," which claims the benefit under 35 U.S.C. § 119(e) of U.S. provisional application Ser. No. 61/735,604, titled "Unconventional Nitride-on-Si Substrate Structures," filed Dec. 11, 2012, each of which is hereby incorporated by reference in its entirety.

STATEMENT REGARDING FEDERALLY SPONSORED RESEARCH OR DEVELOPMENT

This invention was made with Government support under Grant No. DE-AR0000123 awarded by U.S. Department of Energy and under Contract No. FA8721-05-C-0002 awarded by the U.S. Air Force. The Government has certain rights in the invention.

BACKGROUND

1. Field of Invention

The techniques described herein relate to semiconductor devices and methods that can reduce leakage current and increase breakdown voltage for semiconductor devices. Such structures and methods can be used advantageously for devices having a compound semiconductor material such as a III-V semiconductor material, e.g., a III-N semiconductor material, such as GaN (Gallium Nitride), for example, formed over a second semiconductor material, such as silicon, for example.

2. Discussion of the Related Art

Improved power transistors are desired for advanced transportation systems, more robust energy delivery networks and new approaches to high-efficiency electricity generation and conversion. Applications of power transistors include power supplies, automotive electronics, automated factory equipment, motor controls, traction motor drives, high voltage direct current (HVDC) electronics, lamp ballasts, telecommunications circuits and display drives, for example. Such systems rely on efficient converters to step-up or step-down electric voltages, and use power transistors capable of blocking large voltages and/or carrying large currents. In hybrid vehicles, for example, power transistors with blocking voltages of more than 500 V are used to convert DC power from the batteries to AC power to operate the electric motor.

Conventional power devices (e.g., transistors or diodes) used in such applications are made of silicon. However, the limited critical electric field of silicon and its relatively high resistance causes available commercial devices, circuits and systems to be very large and heavy, and operate at low frequencies. Therefore, such commercial devices are unsuitable for future generations of hybrid vehicles and other applications.

Nitride semiconductor devices have been proposed as offering the potential for producing high-efficiency power electronics demanding high blocking voltages and low on-resistances. Nitride semiconductor devices have been formed of semiconductor materials such as gallium nitride (GaN) and aluminum gallium nitride (AlGaN). Nitride semiconductor materials may be epitaxially grown on various types of substrates. SiC (Silicon Carbide), sapphire and Si (Silicon) are the three most widely used substrates for the epitaxial growth of GaN. Each of these substrates has advantages and disadvantages.

SiC has the lowest lattice mismatch with GaN, and thus GaN grown on SiC has the lowest dislocation density and highest quality compared GaN grown on Si or sapphire other substrates. Highly resistive SiC substrates provide good electrical isolation. SiC substrates are also excellent thermal conductors which facilitates extracting heat from GaN transistors. However, the drawbacks of SiC substrates include a limited available wafer size (up to 4 inches) and high cost.

GaN grown on sapphire substrates has been used for the production of GaN-based LEDs (Light Emitting Diodes). Two-inch and three-inch GaN/sapphire wafers have been used by many LED manufacturers, while the usage of four inch-GaN/sapphire wafers has started to increase recently. Six-inch sapphire substrates are also expected to be adopted soon despite their higher cost. However, the major drawback of sapphire substrates is their poor thermal conductivity. In power electronics applications, the increased difficulty of thermal management associated with sapphire substrates makes them less favorable than other alternatives.

Si substrates provide a low cost solution for GaN power electronics. Four-inch and six-inch AlGaN/GaN-on-Si wafers are commercially available. Compared to sapphire substrates, Si also has higher thermal conductivity. Due to the low cost and good thermal conductivity of Si substrates, GaN/Si wafers have become the most popular platform for GaN-based power electronics.

However, the challenge of fabricating GaN transistors on Si substrates is their high leakage current and lower breakdown voltage than in GaN grown on SiC due to the higher conductivity of the Si substrate. Several approaches have been reported to increase the device breakdown voltages. One technique involves increasing the epitaxial layer thickness. However, the limitation of this method is the increased wafer bow with thicker epitaxial nitride layers. The increased wafer bow makes it difficult to fabricate transistors on large GaN-on-Si wafers. Another technique is to use substrate removal and wafer transfer technology, which may increase the breakdown voltage above 1,500 V, even with thin buffer layers.

SUMMARY

Some embodiments relate to a semiconductor device, comprising: a first semiconductor region comprising silicon; a second semiconductor region comprising a nitride semiconductor material, the second semiconductor region being formed over the first semiconductor region; and a current blocking structure formed in the first semiconductor region between first and second terminals of the semiconductor device, the current blocking structure being configured to reduce current flow in the first semiconductor region between the first and second terminals.

Some embodiments relate to a semiconductor device, comprising: a first region comprising a first semiconductor material; a second region comprising a second semiconductor material, the second region being formed over the first region; and a current blocking structure formed in the first region between first and second terminals of the semiconductor device, the current blocking structure being configured to reduce current flow in the first region between the first and second terminals.

Some embodiments relate to a semiconductor device, comprising: a first region comprising a first semiconductor material; a second region comprising a second semiconductor material, the second region being formed over the first region; and means for reducing current flow in the first region between first and second terminals of the semiconductor device.

Some embodiments relate to a method of forming a semiconductor device, the method comprising: etching to remove portions of a first semiconductor region comprising silicon; and forming a second semiconductor region comprising a nitride semiconductor material over the first semiconductor region.

Some embodiments relate to a method of forming a semiconductor device, the method comprising: etching to remove portions of a first semiconductor region comprising silicon; forming a dielectric layer at a surface of the first semiconductor region; and forming, over the first semiconductor region, a second semiconductor region comprising a nitride semiconductor material.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques described herein.

DETAILED DESCRIPTION

According to the innovative techniques described herein, a reduction in leakage current and/or an increase in breakdown voltage can be achieved for compound semiconductor based devices, such as nitride semiconductor devices, for example, formed on a substrate that includes a second semiconductor material, such as silicon, for example. In some embodiments, a current blocking structure may be formed in the substrate to reduce and/or prevent the flow of leakage current through the substrate and/or to engineer the electric field at the surface of the substrate. Such techniques can provide improvements in power transistors that will enable significant improvements in systems such as hybrid vehicles, high efficiency power inverters for solar cells, and power converters for LEDs, for example.

Figure 1A:
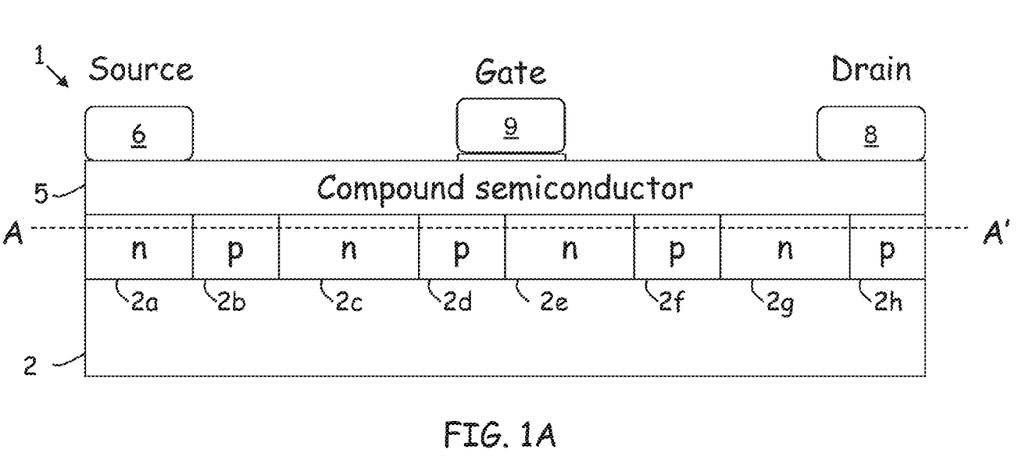
FIGS. 1A and 1B show a semiconductor device having p-n junctions for blocking device leakage current through the underlying substrate.
Figure 1B:
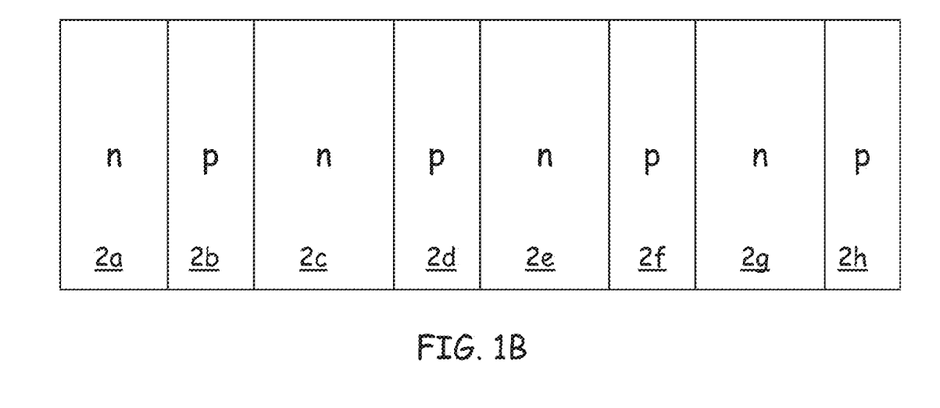

An embodiment of a semiconductor device 1 having a current blocking structure with p-n junctions is shown in FIGS. 1A and 1B, which show a cross-sectional view and a plan view of a semiconductor device along the line A-A', respectively. Semiconductor device 1 includes a substrate 2 having, at its upper surface, a current blocking structure that includes regions 2a-2h of alternating n-type and p-type doping. Regions 2a-2h form p-n junctions that reduce the lateral leakage current of the transistor through the substrate 2 between the source and drain terminals.

In some embodiments, the substrate 2 may be formed of silicon. However, the techniques herein are not limited in this respect, as substrate 2 may be formed of any suitable material, such as a group IV semiconductor (e.g., Si, Ge, etc.) or another type of semiconductor or an insulator. The substrates described herein may be any suitable types of substrates, such as bulk substrates or semiconductor-on-insulator substrates, and are not limited as to any particular material(s).

A compound semiconductor layer 5 may be formed on the substrate 2. As discussed below, compound semiconductor devices may be formed in the compound semiconductor layer 5. The compound semiconductor material of compound semiconductor layer 5 may be any suitable type of material, including a III-V semiconductor material, such as nitride semiconductor material (a III-N semiconductor material). In some embodiments, compound semiconductor layer 5 may include a nitride semiconductor material such as $B_wAl_xIn_yGa_zN$, for example, in which w, x, y and z each have any suitable value between zero and one (inclusive), and w+x+y+z=1. Examples of nitride semiconductor materials include GaN, AN, AlGaN, InAlN, InAlGaN, and InGaN, by way of example and not limitation. In some embodiments, the compound semiconductor layer 5 may be an epitaxial layer grown by a suitable epitaxial growth process. Optionally, in some embodiments a very thin layer of dielectric (e.g., SiN) material may be grown between the substrate 2 and the epitaxial layer 5.

The compound semiconductor layer 5 may include one layer or more than one layer. In some embodiments, the compound semiconductor layer 5 may include a heterostructure having a plurality of layers of different semiconductor materials. For example, in some embodiments a barrier layer comprising $B_{w1}Al_{x1}In_{y1}Ga_{z1}N$ and a channel layer comprising $B_{w2}Al_{x2}In_{y2}Ga_{z2}N$ may be formed in the compound semiconductor layer 5, where a semiconductor material of the barrier layer has a larger bandgap and/or polarization than that of the channel layer. However, the techniques described herein are not limited as to the formation of heterostructures.

A compound semiconductor device may be formed in and/or on the compound semiconductor layer 5. For example, as illustrated in FIG. 1A, a transistor may be formed, such as a power transistor, for example. A source region 6 and drain region 8 of the transistor may be formed in and/or on the compound semiconductor layer 5. In some embodiments, the source region 6 and drain region 8 may be recessed in the compound semiconductor layer 5 by removing a portion of the compound semiconductor layer 5 at the source and drain regions and filling the cavity with the materials used for the source and drain regions. Any suitable materials maybe used for the source and drain regions, such as metal(s) and/or doped semiconductor. A gate 9 to control the transistor may be formed on an optional insulating layer. Optionally, a gate-recess technique may be used to form a normally-off transistor. However, the techniques described herein are not limited as to the source, gate and/or drain regions or particular techniques for fabricating them.

In the embodiment of FIGS. 1A and 1B, semiconductor device 1 has a current blocking structure that includes p-n junctions formed at the surface of the substrate 2 to reduce the leakage current of the transistor through the substrate 2 between the source terminal and the drain terminal. When a high voltage is applied to the drain region 8, the p-n junctions formed at the surface of the substrate 2 become reverse biased, due to the vertical leakage between the compound semiconductor layer 5 and the substrate 2, creating a lateral voltage drop in the substrate 2 across the p-n junctions. The reverse-biased p-n junctions significantly reduce the amount of leakage current that can flow laterally within the substrate 2 between the source region 6 and drain region 8.

FIG. 1B shows a top view of semiconductor device 1 along the line A-A' of FIG. 1A. As shown in FIG. 1B, the alternating p and n doped regions can be formed as stripes, as viewed from above, to prevent leakage current from flowing between the source region 6 and the drain region 8. In some embodiments, the stripes may extend along a direction perpendicular to a line between the source region 6 and the drain region 8, as illustrated in FIGS. 1A and 1B. However, the techniques described herein are not limited to the stripes being formed along a direction that is perpendicular to a line between the source region 6 and the drain region 8, as the stripes may extend along a different angle. In some embodiments, the stripes may extend along a direction that is not parallel with a line between the source region 6 and the drain region 8. In some embodiments, the p and n doped regions may be formed in shapes other than stripes, such as curved shapes, for example, or any other suitable shapes.

In some embodiments, for a given source-to-drain distance, the lateral blocking voltage of a p-n junction may be maximized by having a punch-through structure within n– regions in a silicon substrate. For example, for an n– doping concentration of $10^{15} \sim 10^{16}$ cm$^{-3}$, the length of the n region with a punch-through design may be between about 0.2 μm and 20 μm. In some embodiments, regions 2a-2h may have alternating n– and p+ doping, or alternating n+ and p– doping. The length of p+ regions can be shorter than the n-regions but with high doping levels ($10^{16} \sim 10^{19}$ cm$^{-3}$) to prevent full depletion. Since the high temperature growth of nitride semiconductor could dope a silicon substrate p-type by Ga or Al diffusion, the doping profile of the n– regions can be designed to compensate for the potential doping during growth. However, the techniques described herein are not limited as to particular dimensions of the p-type and n-type regions, or particular doping concentrations or doping profiles, as any suitable dimensions, doping concentrations and doping profiles may be used.

Figure 2:
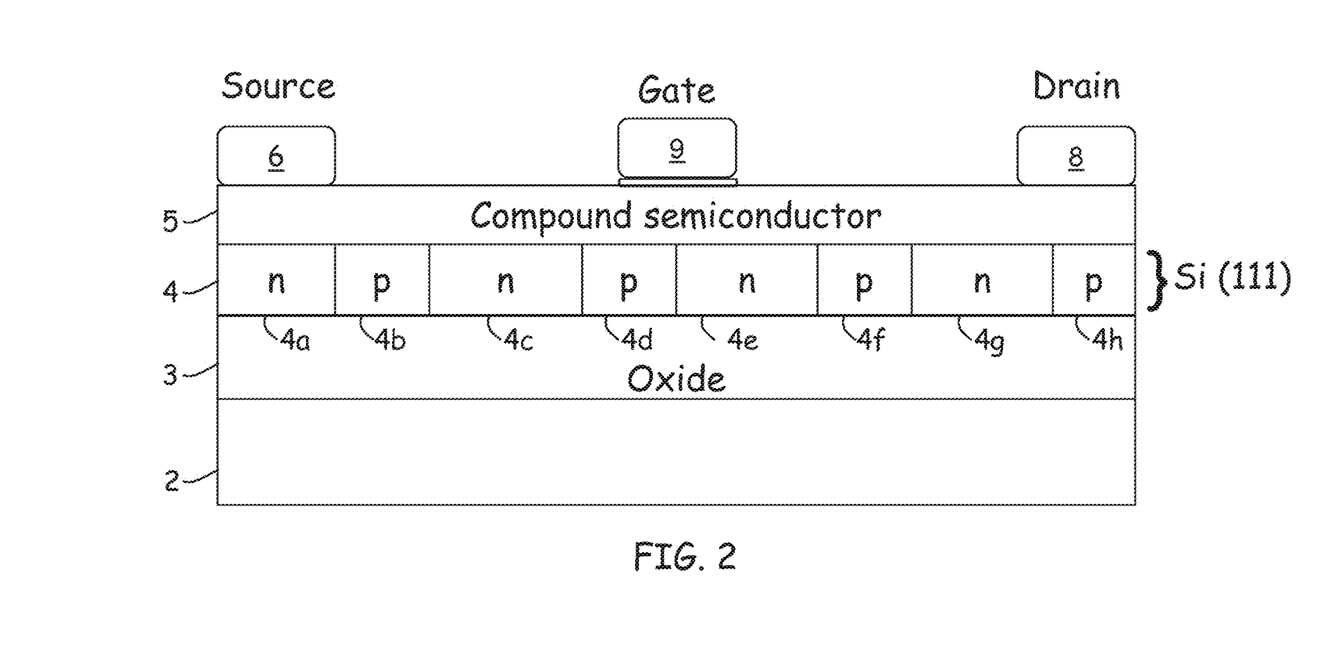
FIG. 2 shows a semiconductor device having p-n junctions for blocking device leakage current through a semiconductor on insulator substrate.

FIG. 2 shows another embodiment in which a blocking structure including p-n junctions is formed in a semiconductor-on-insulator substrate to reduce or prevent the leakage current from flowing in the substrate. A semiconductor-on-insulator substrate may have silicon or another semiconductor material formed on an insulating layer. In the embodiment of FIG. 2, a silicon-on-insulator wafer (SOI) (including layers 2, 3 and 4) is used. With the SOI structure, the thickness of the top layer of Si 4 can be minimized to reduce the reverse biased leakage current through the p-n junctions. The thickness of Si layer 4 can be between 10 and 2000 nm, for example. The Si layer 4 may have a (111) orientation, as shown in FIG. 2, or any other suitable crystal orientation. The Si layer 4 can be doped to have alternating regions 4a-4h of n and p doping, as in the embodiment of FIG. 1A. In the embodiment of FIG. 2, the Si substrate 2 can be grounded to provide a field plate effect that increases the blocking voltage of the p-n junctions.

Figure 3A:
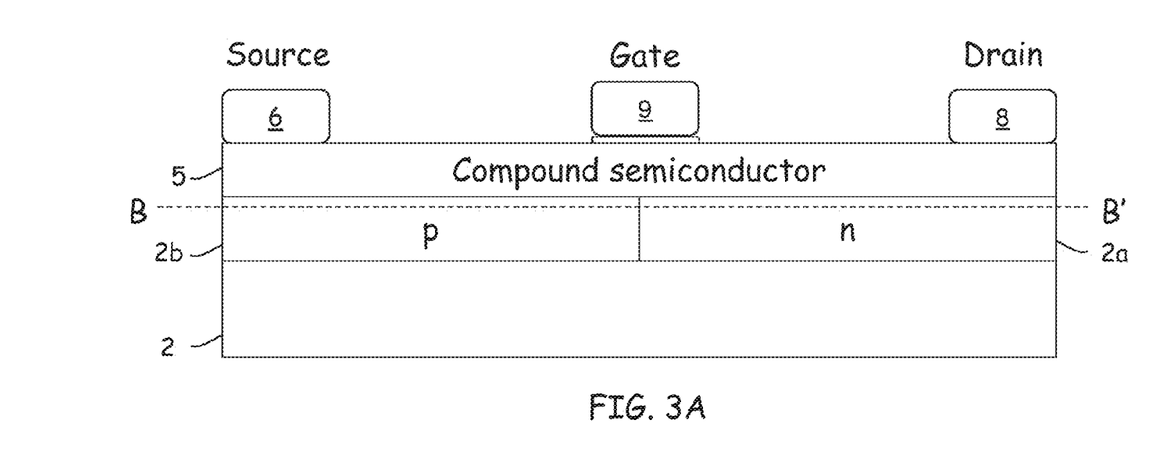
FIGS. 3A and 3B shows a semiconductor device having a single p-n junction for blocking device leakage current through the underlying substrate.
Figure 3B:
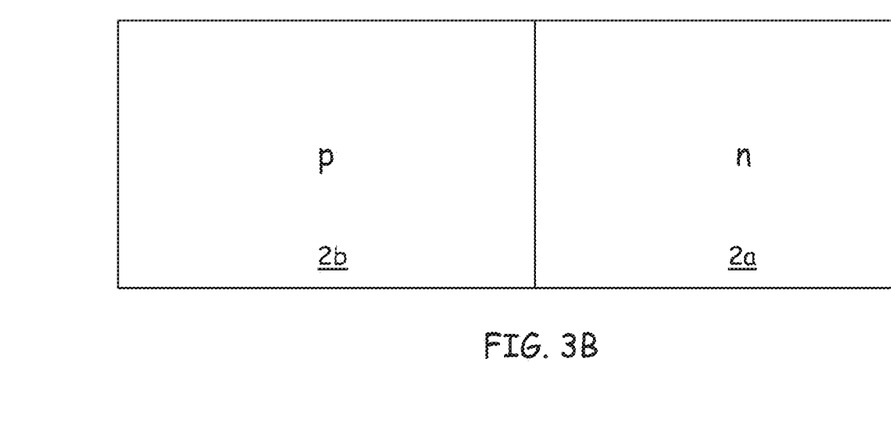

Although the use of a plurality of p-n junctions as a current blocking structure has been illustrated in the embodiments described above, a current blocking structure may have any suitable number of p-n junctions. In some embodiments, a current blocking structure may have a single p-n junction, as illustrated in FIGS. 3A and 3B. FIG. 3A illustrates a cross sectional view and FIG. 3B illustrates a plan view along the line B-B' of an embodiment of a semiconductor device with a single p-n junction. Region 2b in FIG. 3A may be doped p-type and region 2a in FIG. 3A may be doped n-type when the drain voltage is higher than that of the source, thereby reverse-biasing the p-n junction. If the source is to be at a higher voltage than the drain, the doping polarities of regions 2a and 2b may be reversed. In some embodiments when the drain switches between higher and lower voltages than the source voltage, at least two p-n junctions may be included in the substrate 2. Such p-n junctions may be formed by any suitable combination of doped regions, such as p-n-p or n-p-n, for example.

Figure 4A:
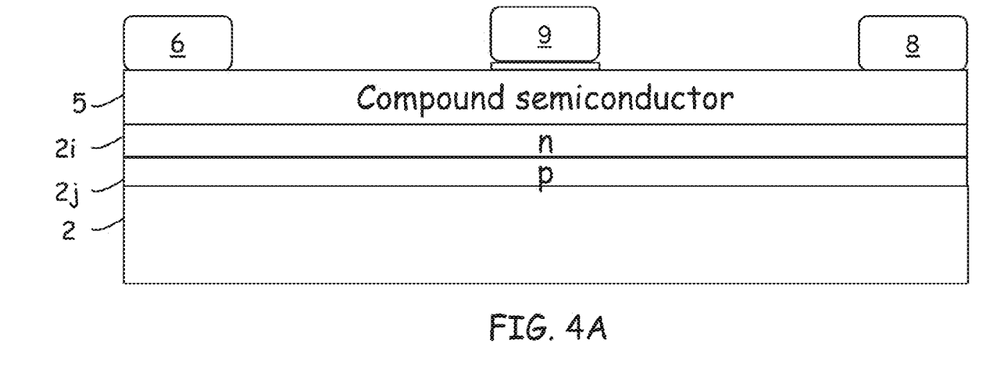
FIG. 4A shows a semiconductor device having a p-n junction extending laterally across a semiconductor device.
Figure 4B:
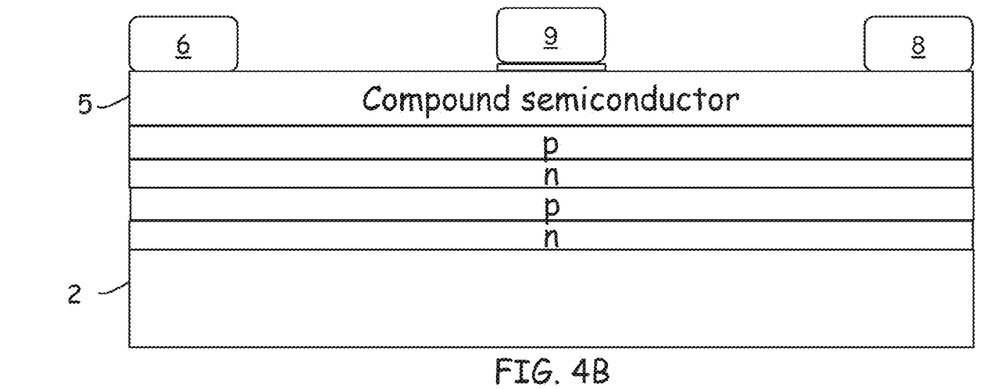
FIG. 4B shows a semiconductor device having a plurality of p-n junctions extending laterally across a semiconductor device.

In some embodiments, p-type and n-type regions may be stacked vertically such that a p-n junction extends laterally across the device, as illustrated in FIG. 4A. Such a structure may reduce the vertical flow of current between the compound semiconductor layer 5 and the substrate 2. As shown in FIG. 4A, an n-type doped region 2i may be formed over a p-typed doped region 2j at the upper surface of the substrate 2. However, in some embodiments, the doping polarity may be reversed, as a p-type doped region may be formed over an n-type doped region. In some embodiments, a plurality of p-n junctions may be formed to extend laterally across the device by vertically stacking a plurality of alternating p-type and n-type regions, as shown in FIG. 4B.

Figure 4C:
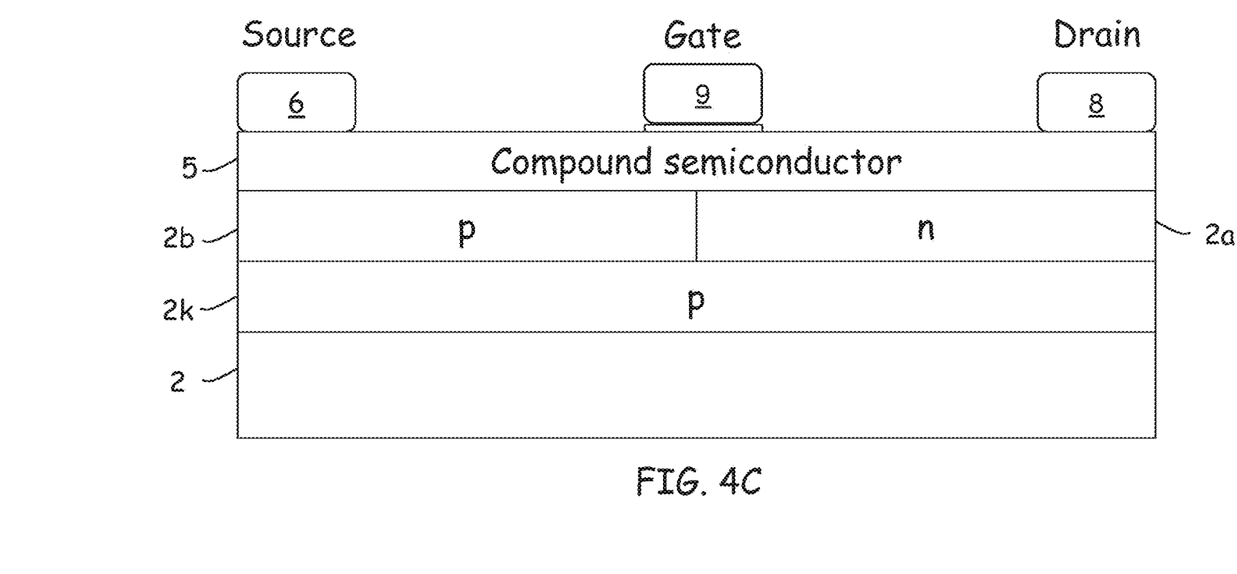
FIG. 4C shows a semiconductor device having a first p-n junction extending laterally across a semiconductor device and a second p-n junction extending vertically and positioned between the terminals of a semiconductor device.

In some embodiments, p-type and n-type regions may be arranged to form p-n junctions extending in a plurality of directions. For example, as illustrated in FIG. 4C, a first p-n junction may extend between regions 2a and 2b to prevent lateral current flow and a second p-n junction may extend between regions 2a and 2k to prevent vertical current flow.

Figure 4D:
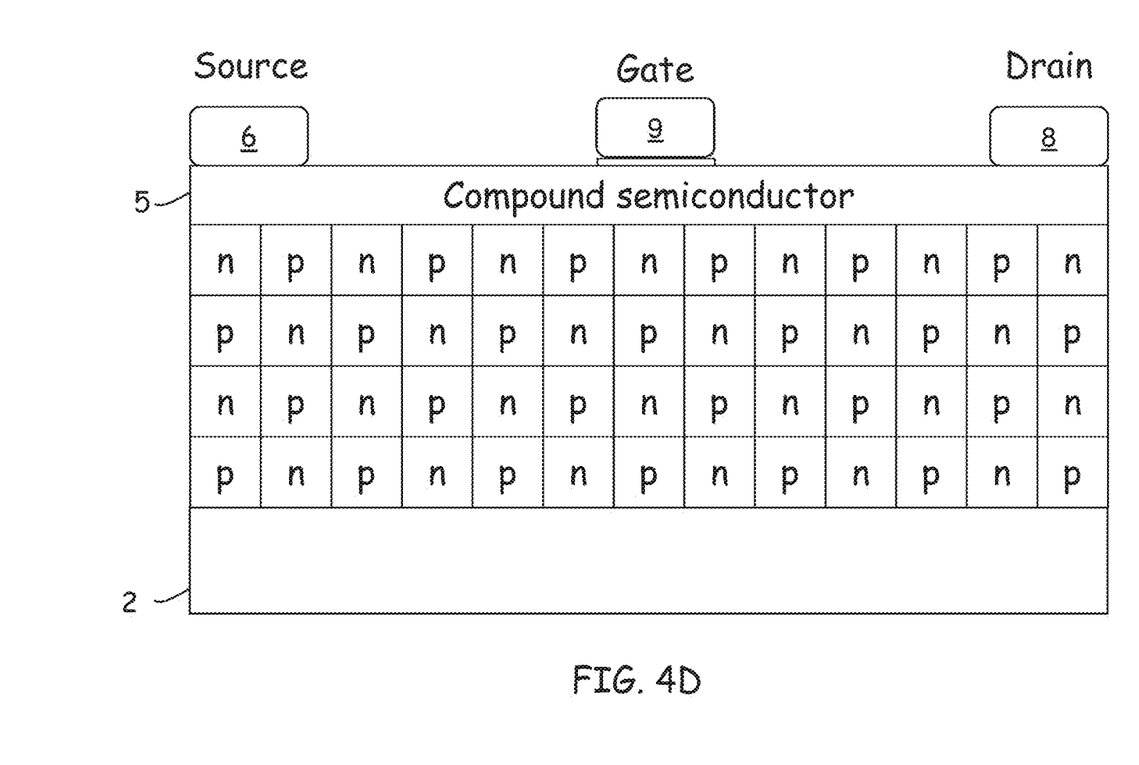
FIG. 4D shows a semiconductor device having a plurality of p-n junctions formed by a plurality of n-type and p-type regions.

In some embodiments, a plurality of lateral and vertical p-n junctions may be produced by forming a pattern of alternating p-type and n-type regions, as shown in FIG. 4D. Although the junctions between the n and p doped regions have been illustrated as planes either perpendicular or parallel to a line between the source and drain, it should be appreciated that the p-n junctions can have other shapes and orientations. Any suitable number and arrangement of p-n junctions may be used.

Above has been described examples of current blocking structures that can reduce and/or prevent the flow of current in the substrate between terminals (e.g., source region 6 and drain region 8) formed in and/or above the compound semiconductor layer 5. However, the techniques described herein are not limited to reducing and/or preventing the flow of current between terminals formed in and/or above the compound semiconductor layer, In some embodiments, a terminal may be formed in the substrate. and a current blocking structure may reduce and/or prevent the flow of current between the terminal in the substrate and the terminal(s) (e.g., the drain and/or source) in and/or over the compound semiconductor layer. In some embodiments, one or more p-n junctions extending laterally across the substrate (e.g., as shown in FIGS. 4A-4D) may be suitable for reducing and/or preventing the flow of current between a terminal in the substrate and the terminal(s) in and/or over the compound semiconductor layer. However, the techniques described herein are not limited in this respect, as other types of current blocking structures may be used. In some embodiments, a current blocking structure may reduce and/or prevent the flow of current between terminals both laterally and vertically. For example, a current blocking structure may reduce and/or prevent current flow both between terminals (e.g., source region 6 and drain region 8) formed in and/or above the compound semiconductor layer 5, and between a terminal formed in the substrate and the terminal(s) in and/or over the compound semiconductor layer.

Above, p-n junction(s) are described as examples of current blocking structures that reduce or prevent the flow of leakage current through a substrate underlying a compound semiconductor device. However, the current blocking structures described herein are not limited to p-n junctions. Other examples of current blocking structures are described below.

Figure 5:
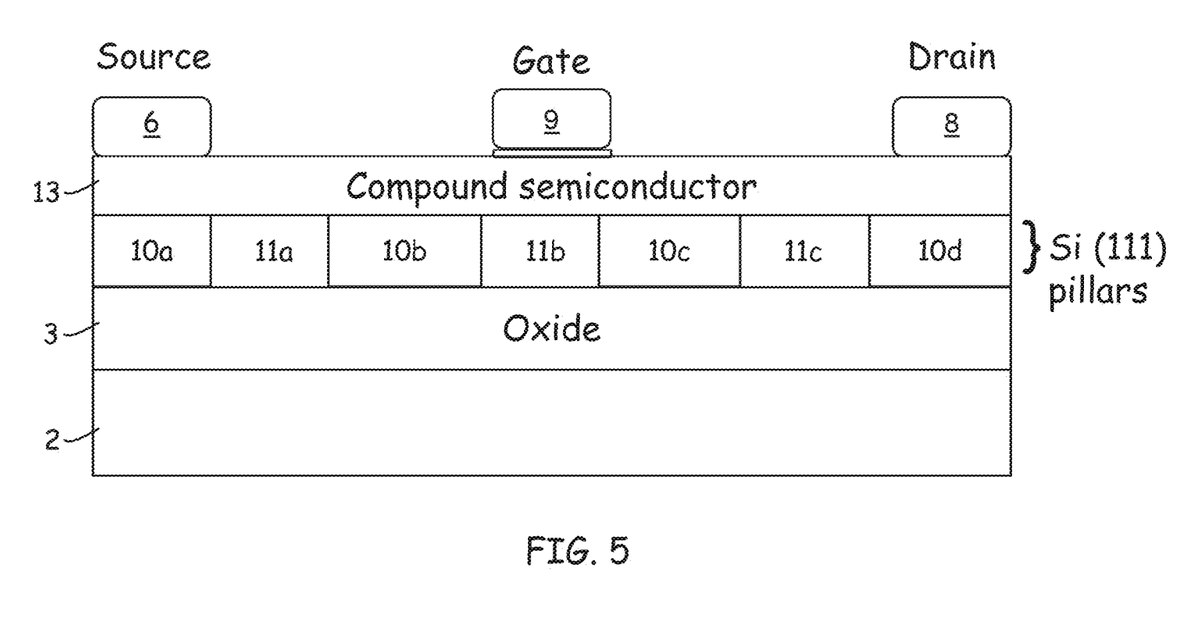
FIG. 5 shows a semiconductor device that includes pillars of semiconductor separated by insulating regions, according to some embodiments.

The inventors have appreciated that since silicon has a relatively low band gap energy, the lateral blocking voltage of the p-n junctions can be limited by the critical electric field of silicon. At high temperatures, the leakage current through the silicon may increase. FIG. 5 shows another embodiment that can overcome these obstacles.

In some embodiments, one or more insulating region(s) are formed as current blocking region(s) to reduce the leakage current and increase the blocking voltage. Such insulating region(s) may be formed in a bulk semiconductor substrate or a semiconductor-on-insulator substrate. FIG. 5 shows an embodiment in which insulating regions are formed in a semiconductor-on-insulator substrate. The structure of FIG. 5 includes a semiconductor substrate 2 which can be formed of Si, for example, an insulating layer 3 which can be formed of oxide, for example, semiconductor pillars 10a-10d which can be formed of Si, for example, insulating regions 11a-11c, and a compound semiconductor layer 13, which may include a III-V semiconductor material, such as a nitride semiconductor material. This structure can greatly reduce or eliminate the leakage current between the pillars 10a-10d, thereby increasing the breakdown voltage of the device significantly. Another advantage is that this structure can be used in high temperature conditions without increasing leakage current from the substrate.

This structure also reduces the dislocation densities in epitaxial grown nitride semiconductors. Thicker and higher quality of compound semiconductor can be grown while reducing wafer bow, and, as a consequence, larger semiconductor wafers (e.g., larger Si wafers) can be used. In some embodiments, insulating regions 11a-11c may be formed of a high critical electric field material such as AN, SiN, SiC, polycrystalline diamond, $SiO_2$, or any other dielectric with a critical electric field higher than 30 kV/cm, for example. However, the techniques described herein are not limited in this respect, as any suitable insulating material may be used.

In some embodiments, the insulating regions 11a-11c may be include a gas, such as air, or a vacuum.

In some embodiments, insulating regions 11a-11c can be voids. Insulating regions 11a-11c may form channels beneath the compound semiconductor region 13, and dielectric fluid can be pumped into the channels between the semiconductor pillars to be used for fluid cooling of the structure. Various approaches can be used to fabricate such voids, and several different techniques can be used to grow the compound semiconductor material, such as lateral overgrown epitaxy. In some embodiments, free standing compound semiconductor, e.g., a nitride semiconductor, such as GaN, can be achieved by releasing the compound semiconductor from the underlying substrate through wet etching of the buried oxide 3.

Figures 6A, 6B:
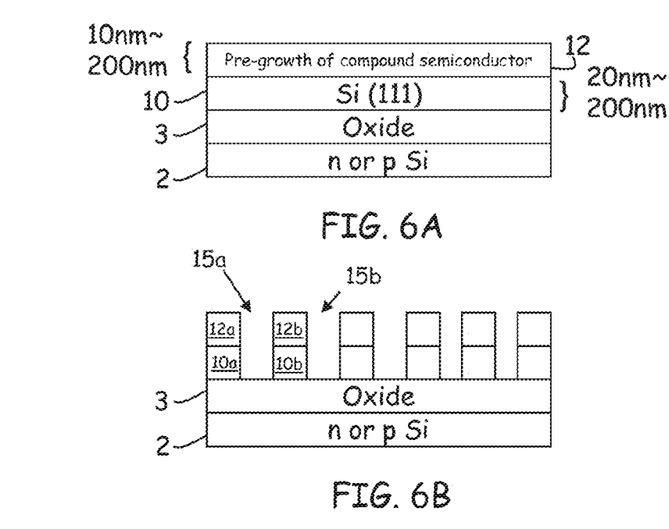
FIGS. 6A-C show an example of a process for forming the semiconductor device having insulating regions, according to some embodiments.
Figure 6C:
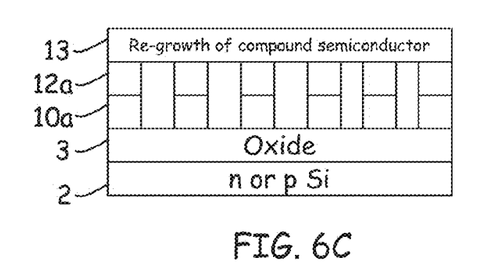

FIG. 6A-6C show exemplary steps of a method of forming the semiconductor device of FIG. 5. The technique shown in FIGS. 6A-6C may be applied to any suitable substrate, such as a bulk semiconductor substrate or a semiconductor-on-insulator substrate. As shown in FIG. 6A, a SOI wafer (including layers 2, 3, and 10) may be used and a compound semiconductor layer 12 (e.g., a III-V semiconductor layer, such as a III-N semiconductor layer) may be epitaxially grown on the silicon layer 10. As shown in FIG. 6B, layers 12 and 10 may be etched into a selected pattern. The structure may be patterned using photolithography or any other suitable patterning technique. Selected portions of layers 10 and 12 are removed by etching to leave regions 10a, 12a, etc., as shown in FIG. 6B. The resulting trenches 15a, 15b, etc. may be filled with insulating material, as discussed above, or may be left devoid of material to form buried voids or channels. As shown in FIG. 6C, a compound semiconductor layer 13 (e.g., a III-V semiconductor layer, such as a III-N semiconductor layer) may then be epitaxially re-grown on regions 12a, 12b, etc. Any suitable compound semiconductor re-growth technique may be used, such as epitaxial re-growth techniques that are known in the art.

Figure 7A:
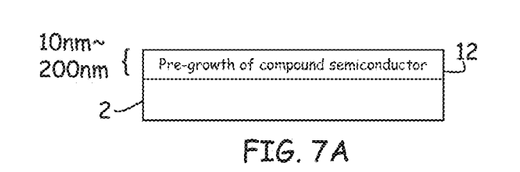
FIGS. 7A-D shows another example of a process for forming the semiconductor device having insulating regions, according to some embodiments.
Figure 7B:
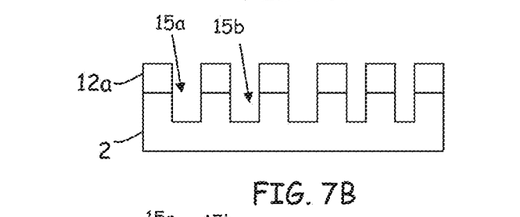
Figure 7C:
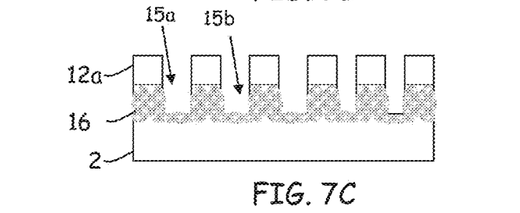
Figure 7D:
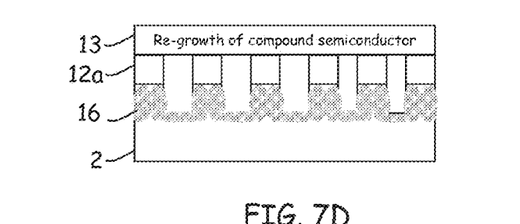

FIG. 7A-7D show exemplary steps of another method of forming a semiconductor device having insulating regions(s) without using an SOI wafer. However, the technique shown in FIGS. 7A-7D may be applied to any suitable substrate, such as a bulk semiconductor substrate or a semiconductor-on-insulator substrate. As shown in FIG. 7A, a compound semiconductor layer 12 may be epitaxially grown on a semiconductor substrate 2 (e.g., silicon). As shown in FIG. 7B, layers 12 and 2 may be etched into a selected pattern forming pillar structures. The structure may be patterned using photolithography or any other suitable patterning technique. A dielectric layer 16, such as thermal oxide, can be grown at the exposed surface of layer 2, as shown in FIG. 7C. The resulting trenches 15a, 15b, etc. may be filled with insulating material, as discussed above, or may be left devoid of material to form buried voids or channels. As shown in FIG. 7D, a compound semiconductor layer 13 may then be epitaxially re-grown on regions 12a, 12b, etc. Any suitable compound semiconductor re-growth technique may be used, such as epitaxial re-growth techniques that are known in the art.

In some embodiments, the formation of compound semiconductor layer 12 can be omitted from the processes shown in FIGS. 6 and 7. For example, in an embodiment in which the compound semiconductor layer 12 is omitted from the process shown in FIG. 6, layer 10 can be formed and then patterned, and compound semiconductor layer 13 can be epitaxially grown on the patterned regions, 10a, 10b, etc. The patterned regions 10a, 10b, etc., can be formed close enough together such that the nitride semiconductor layer 13 coalesces to form a two-dimensional film on the patterned regions 10a, 10b, etc., as illustrated in FIG. 5. In an embodiment in which compound semiconductor layer 12 is omitted from the process shown in FIG. 7, Si layer 2 can be etched to form trenches 15 and Si pillars and a dielectric layer, such as thermally grown oxide, can be grown on the exposed surface of Si layer 2 on the sides and bottom of the trenches. The compound semiconductor layer 13 can then be grown on layer 2 above the trenches, such that the compound semiconductor layer 13 coalesces to form a two-dimensional film on the pillars, leaving cavities or channels in the region of trenches 15.

Figure 8:
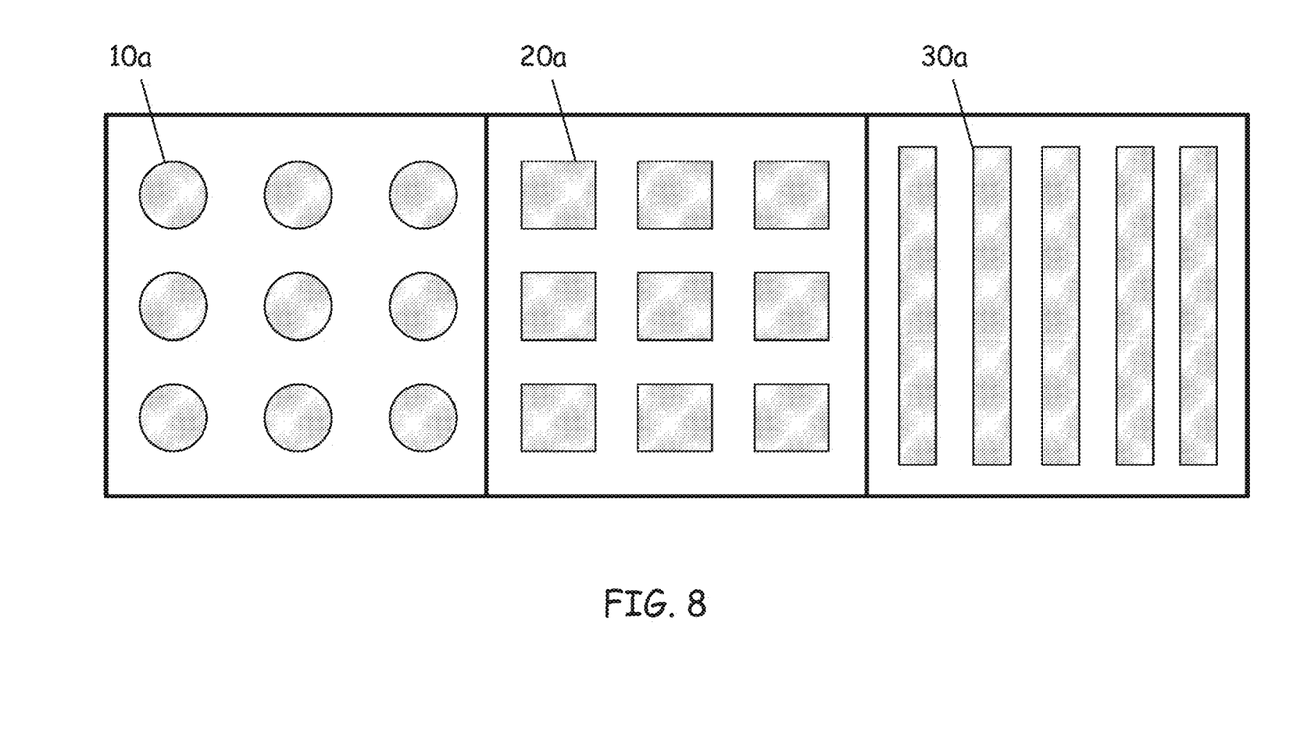
FIG. 8 shows a variety of shapes in which the semiconductor pillars of FIG. 5 may be formed, according to some embodiments.

As shown in FIG. 8, the Si "pillar" regions 10a, 10b, etc., and the patterned nitride semiconductor regions 12a, 12b, etc. thereon may be formed into any of a variety of shapes 10a, 20a or 30a, for example. From the top view perspective, the pillar structures can be have a circular, rectangular, or striped shapes, as shown in FIG. 8. A multiwall structure or other designs can be used. Any suitable pitch and filling factor of the pillars can be used. For example, the dimensions of the circular, rectangular and stripe pillars can be from 0.1 μm to several micro-meters, in some embodiments. The gap between these pillars can be from 0.1 μm to 1~20 μm example. In some embodiments, the gaps between adjacent pillars can be 20 μm or less, such as 1 μm or less, or 500 nm or less, for example. Similarly, the p-n junctions 2a-h and 4a-h can also be formed in a variety of shapes and patterns, such as those shown in FIG. 8.

As discussed above, the techniques described herein can improve nitride transistor breakdown voltage, reduce device leakage, improve nitride material quality and potentially can enable the production of free standing GaN wafers. Previously, the high leakage current due to the Si substrate and large wafer bow due to thick nitride epitaxial growth were challenging problems. The structures and techniques described herein address the leakage problem so that GaN transistors having high a blocking voltage can be achieved. For example, in some embodiments a transistor having a blocking voltage above 1000 V can be produced. However, the techniques described herein are not limited with respect to blocking voltage.

These innovative structures and related techniques are an enabling platform for producing improved devices that can significantly improve today's energy systems. Some examples of these systems include hybrid vehicles, high efficiency power inverters for solar cells, and power converters for LEDs. High voltage power electronic transistors can be formed that provide excellent performance for a variety of applications. These new structures have many applications in high voltage power electronics, power amplification and digital electronics, for example.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A semiconductor device, comprising:
a first semiconductor region that is a silicon region;
a second semiconductor region comprising a nitride semiconductor material, the second semiconductor region being formed over the silicon region;
first and second terminals of the semiconductor device over the second semiconductor region; and
at least one p-n junction formed in the silicon region between the first and second terminals, the at least one p-n junction being configured to reduce lateral current flow in the silicon region between the first and second terminals.

2. The semiconductor device of claim 1, wherein the at least one p-n junction comprises a first p-n junction that extends in a direction perpendicular to an interface between the silicon region and the second semiconductor region.

3. The semiconductor device of claim 1, wherein a third terminal is formed in the silicon region and the at least one p-n junction is further configured to reduce current flow between the third terminal and the first terminal.

4. The semiconductor device of claim 1, wherein the silicon region is at least a portion of a substrate, the substrate being a bulk semiconductor substrate or a semiconductor-on insulator-substrate.

5. The semiconductor device of claim 1, wherein the at least one p-n junction extends to an interface between the silicon region and the second semiconductor region.

6. The semiconductor device of claim 1, wherein the at least one p-n junction is configured to reduce current flow in the silicon region along a direction perpendicular to the interface between the silicon region and the second semiconductor region.

7. The semiconductor device of claim 1, wherein a p-type region and an n-type region form the at least one p-n junction.

8. The semiconductor device of claim 7, wherein the p-type region and the n-type region are arranged as stripes.

9. The semiconductor device of claim 1, wherein the at least one p-n junction comprises a plurality of p-n junctions.

10. The semiconductor device of claim 1, wherein the semiconductor device is a transistor, wherein the first terminal is a drain terminal of the transistor, and wherein the second terminal is a source terminal of the transistor.

11. A semiconductor device, comprising:
a silicon region;
semiconductor pillars disposed over the silicon region between first and second terminals of the semiconductor device;

an insulating region between the semiconductor pillars to reduce leakage current between the semiconductor pillars; and a semiconductor region comprising a nitride semiconductor material, the semiconductor region being formed over the semiconductor pillars.

12. The semiconductor device of claim 11, wherein the insulating region comprises a dielectric material.

13. The semiconductor device of claim 12, wherein the dielectric material comprises a dielectric fluid.

14. The semiconductor device of claim 12, wherein the dielectric material comprises at least one of AN, SiN, SiC, polycrystalline diamond, SiO2, or another dielectric material with a critical electric field higher than 30 kV/cm.

15. The semiconductor device of claim 11, wherein the semiconductor pillars comprise silicon.

16. The semiconductor device of claim 11, wherein adjacent semiconductor pillars are separated from one another by no more than 20 μm.

* * * * *